United States Patent
Xu

(10) Patent No.: US 10,288,960 B2
(45) Date of Patent: May 14, 2019

(54) ARRAY SUBSTRATE AND LIQUID CRYSTAL DISPLAY DEVICE

(71) Applicant: Shenzhen China Star Optoelectronics Technology Co., Ltd., Shenzhen, Guangdong (CN)

(72) Inventor: Xiangyang Xu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 437 days.

(21) Appl. No.: 15/033,637

(22) PCT Filed: Mar. 3, 2016

(86) PCT No.: PCT/CN2016/075475
§ 371 (c)(1),
(2) Date: Apr. 30, 2016

(87) PCT Pub. No.: WO2017/140004
PCT Pub. Date: Aug. 24, 2017

(65) Prior Publication Data
US 2018/0052372 A1    Feb. 22, 2018

(30) Foreign Application Priority Data
Feb. 18, 2016 (CN) .......................... 2016 1 0090983

(51) Int. Cl.
*G02F 1/1362* (2006.01)
*G02F 1/1368* (2006.01)
(Continued)

(52) U.S. Cl.
CPC ...... *G02F 1/136204* (2013.01); *G02F 1/1368* (2013.01); *G02F 1/136286* (2013.01);
(Continued)

(58) Field of Classification Search
CPC ............. G02F 1/136204; G02F 1/1362; G02F 1/136286; G02F 1/1368; G02F 2202/22;
(Continued)

(56) References Cited

U.S. PATENT DOCUMENTS

2003/0030054 A1* 2/2003 Hector .............. G02F 1/136204
257/72
2010/0155724 A1* 6/2010 Hong ...................... H01L 23/60
257/48

(Continued)

*Primary Examiner* — Mark Edwards
(74) *Attorney, Agent, or Firm* — Andrew C. Cheng

(57) ABSTRACT

The present invention discloses an array substrate, and the array substrate comprises a substrate, a plurality of data lines and a plurality of scan lines; the substrate comprises a display region and a peripheral circuit region located at peripheral sides of the display region, and each data line comprises a data line outer section and a data line inner section, and each scan line comprises a scan line outer section and a scan line inner section; the peripheral circuit region further comprises a short connection line, an enable signal line, a plurality of first thin film transistors, a plurality of second thin film transistors, a plurality of first electrostatic discharge protection circuits, a plurality of second electrostatic discharge protection circuits, a plurality of third electrostatic discharge protection circuits and a plurality of fourth electrostatic discharge protection circuits.

12 Claims, 4 Drawing Sheets

(51) Int. Cl.
  *H01L 27/02* (2006.01)
  *G09G 3/36* (2006.01)
  *H01L 27/12* (2006.01)

(52) U.S. Cl.
  CPC ............ *G09G 3/36* (2013.01); *G09G 3/3648* (2013.01); *H01L 27/02* (2013.01); *H01L 27/0266* (2013.01); *H01L 27/0292* (2013.01); *H01L 27/0296* (2013.01); *H01L 27/1244* (2013.01); *G02F 2202/22* (2013.01); *G09G 2300/0819* (2013.01); *G09G 2330/04* (2013.01); *G09G 2330/06* (2013.01)

(58) Field of Classification Search
  CPC .................. G09G 3/36; G09G 3/3648; G09G 2330/0819; G09G 2330/06; G09G 2330/04; H01L 27/02; H01L 27/0266; H01L 27/0292; H01L 27/0296; H01L 27/1244
  See application file for complete search history.

(56) References Cited

U.S. PATENT DOCUMENTS

2017/0038650 A1* 2/2017 Nakanishi ............. G02F 1/1343
2017/0229447 A1* 8/2017 Sankaralingam ... H01L 27/0259

\* cited by examiner

ARRAY SUBSTRATE AND LIQUID CRYSTAL DISPLAY DEVICE

CROSS REFERENCE

This application claims the priority of Chinese Patent Application No. 201610090983.1, entitled "Array substrate and liquid crystal display device and drive method of liquid crystal display device", filed on Feb. 18, 2016, the disclosure of which is incorporated herein by reference in its entirety.

FIELD OF THE INVENTION

The present invention relates to a display skill field, and more particularly to an array substrate and a liquid crystal display device having the array substrate.

BACKGROUND OF THE INVENTION

The array substrate is the important component of the thin film transistor liquid crystal display device, such as the thin film transistor liquid crystal display (TFT-LCD). The array substrate generally comprises the peripheral circuit region and the display region. In the manufacture and usage process of the array substrate, the electrostatic charge inevitably generates due to the factors of charged particles, the engineering condition, row material and design. Particularly, the electrostatic charge generated in the peripheral circuit region of the array substrate is high voltage electrostatic charge in general.

The electrostatic issue can directly influence the yield of the array substrate, and thus to influence the product yield of the liquid crystal display device. As the high voltage electrostatic charge is released, and no effective path is on the array substrate to derive the electrostatic charge in time, it is highly possible that the precision component on the array substrate may breakdown, and particularly, respective components in the display region are extremely precise, which can be easily broke down by the high voltage electrostatic charge. For instance, the thin film transistor array is extremely precise, and can be easily broke down by the high voltage electrostatic charge of the peripheral circuit region. The thin film transistor array is the key component of the array substrate. Once it is broke down, it leads to the poor quality or failure of the liquid crystal display.

In prior art, the ESD rings are located at the ends of the lines (such as gate lines and the data lines) of the array substrate in general to connect the ESD rings with the short connection line and to make all the lines in the array substrate connect with short connection line. Accordingly, the electrostatic charge can be derived to the ground through the ESD ring as the electrostatic charge is released. However, in such design, the ESD ring and the short connection line may connect the circuit in the peripheral circuit region of the array substrate with the circuit in the display region of the array substrate, and the high voltage electrostatic charge mostly generates in the peripheral circuit region of the array substrate. In the manufacture process or usage process of the array substrate, the precision component in the display region still has chance to be broken down or damaged as the high voltage electrostatic charge accumulation of the peripheral circuit region is over large and/or as the high voltage electrostatic release point is close to the display region.

SUMMARY OF THE INVENTION

An objective of the present invention is to provide an array substrate, and the electrostatic discharge protection circuits of the array substrate can effectively remove the electrostatic charge, and separate the electrostatic charge of the peripheral circuit region and the electrostatic charge of the display region to prevent the breakdown of the component in the display region as the high voltage electrostatic charge accumulation of the peripheral circuit region is over large or as the high voltage electrostatic release point is close to the display region.

Besides, the present invention further provides an array substrate having the array substrate.

For solving the aforesaid technical issue, the technical solution employed by the present invention is:

First, the present invention provides an array substrate, comprising a substrate and a plurality of data lines and a plurality of scan lines located on the substrate; wherein the substrate comprises a display region and a peripheral circuit region located at peripheral sides of the display region, and each data line comprises a data line outer section and a data line inner section, and each scan line comprises a scan line outer section and a scan line inner section, and the data line outer section and the scan line outer section are located in the peripheral circuit region, and both the data line inner section and the scan line inner section extend from the peripheral circuit region to the display region;

the peripheral circuit region further comprises a short connection line, an enable signal line, a plurality of first thin film transistors, a plurality of second thin film transistors, a plurality of first electrostatic discharge protection circuits, a plurality of second electrostatic discharge protection circuits, a plurality of third electrostatic discharge protection circuits and a plurality of fourth electrostatic discharge protection circuits, and both gates of each first thin film transistor and each second thin film transistor are coupled to the enable signal line, and a drain of the first thin film transistor is coupled to a data line outer section of one data line, and a source of the first thin film transistor is coupled to a data line inner section of the same data line; a drain of the second thin film transistor is coupled to a data line outer section of one data line, and a source of the second thin film transistor is coupled to a data line inner section of the same data line; one end of the first electrostatic discharge protection circuit is coupled to the data line outer section, and the other end is coupled to the short connection line; one end of the second electrostatic discharge protection circuit is coupled to the data line inner section, and the other end is coupled to the short connection line; one end of the third electrostatic discharge protection circuit is coupled to the scan line outer section, and the other end is coupled to the short connection line; one end of the fourth electrostatic discharge protection circuit is coupled to the scan line inner section, and the other end is coupled to the short connection line; the enable signal line controls on or off of the first thin film transistor and the second thin film transistor.

The first electrostatic discharge protection circuit comprises a third thin film transistor, and a gate and a drain of the third thin film transistor are coupled to the data line outer section, and a source is coupled to the short connection line, and the second electrostatic discharge protection circuit comprises a fourth thin film transistor, and a gate and a drain of the fourth thin film transistor are coupled to the data line inner section, and a source is coupled to the short connection line.

The first electrostatic discharge protection circuit further comprises a seventh thin film transistor, and the seventh thin film transistor and the third thin film transistor are coupled in parallel or in series; the second electrostatic discharge protection circuit further comprises an eighth thin film transistor, and the eighth thin film transistor and the fourth thin film transistor are coupled in parallel or in series.

The third electrostatic discharge protection circuit comprises a fifth thin film transistor, and a gate and a drain of the fifth thin film transistor are coupled to the data line outer section, and a source of the fifth thin film transistor is coupled to the short connection line, and the fourth electrostatic discharge protection circuit comprises a sixth thin film transistor, and a gate and a drain of the sixth thin film transistor are coupled to the data line inner section, and a source of the sixth thin film transistor is coupled to the short connection line.

The third electrostatic discharge protection circuit further comprises a ninth thin film transistor, and the ninth thin film transistor and the fifth thin film transistor are coupled in parallel or in series; the fourth electrostatic discharge protection circuit further comprises a tenth thin film transistor, and the tenth thin film transistor and the sixth thin film transistor are coupled in parallel or in series.

As the enable signal line is in a high voltage level state, the first thin film transistor and the second thin film transistor are in an on state, and as the enable signal line is in a low voltage level state, the first thin film transistor and the second thin film transistor are in an off state.

As the first thin film transistor and the second thin film transistor are in an on state, the display region works, and as the first thin film transistor and the second thin film transistor are in an off state, the display region stops working.

Second, the present invention further provides a liquid crystal display device, wherein the liquid crystal display device comprises an array substrate, and the array substrate comprises a substrate and a plurality of data lines and a plurality of scan lines located on the substrate; wherein the substrate comprises a display region and a peripheral circuit region located at peripheral sides of the display region, and each data line comprises a data line outer section and a data line inner section, and each scan line comprises a scan line outer section and a scan line inner section, and the data line outer section and the scan line outer section are located in the peripheral circuit region, and both the data line inner section and the scan line inner section extend from the peripheral circuit region to the display region;

the peripheral circuit region further comprises a short connection line, an enable signal line, a plurality of first thin film transistors, a plurality of second thin film transistors, a plurality of first electrostatic discharge protection circuits, a plurality of second electrostatic discharge protection circuits, a plurality of third electrostatic discharge protection circuits and a plurality of fourth electrostatic discharge protection circuits, and both gates of each first thin film transistor and each second thin film transistor are coupled to the enable signal line, and a drain of the first thin film transistor is coupled to a data line outer section of one data line, and a source of the first thin film transistor is coupled to a data line inner section of the same data line; a drain of the second thin film transistor is coupled to a data line outer section of one data line, and a source of the second thin film transistor is coupled to a data line inner section of the same data line; one end of the first electrostatic discharge protection circuit is coupled to the data line outer section, and the other end is coupled to the short connection line; one end of the second electrostatic discharge protection circuit is coupled to the data line inner section, and the other end is coupled to the short connection line; one end of the third electrostatic discharge protection circuit is coupled to the scan line outer section, and the other end is coupled to the short connection line; one end of the fourth electrostatic discharge protection circuit is coupled to the scan line inner section, and the other end is coupled to the short connection line; the enable signal line controls on or off of the first thin film transistor and the second thin film transistor.

The first electrostatic discharge protection circuit comprises a third thin film transistor, and a gate and a drain of the third thin film transistor are coupled to the data line outer section, and a source is coupled to the short connection line, and the second electrostatic discharge protection circuit comprises a fourth thin film transistor, and a gate and a drain of the fourth thin film transistor are coupled to the data line inner section, and a source is coupled to the short connection line.

The first electrostatic discharge protection circuit further comprises a seventh thin film transistor, and the seventh thin film transistor and the third thin film transistor are coupled in parallel or in series; the second electrostatic discharge protection circuit further comprises an eighth thin film transistor, and the eighth thin film transistor and the fourth thin film transistor are coupled in parallel or in series.

The third electrostatic discharge protection circuit comprises a fifth thin film transistor, and a gate and a drain of the fifth thin film transistor are coupled to the data line outer section, and a source of the fifth thin film transistor is coupled to the short connection line, and the fourth electrostatic discharge protection circuit comprises a sixth thin film transistor, and a gate and a drain of the sixth thin film transistor are coupled to the data line inner section, and a source of the sixth thin film transistor is coupled to the short connection line.

The third electrostatic discharge protection circuit further comprises a ninth thin film transistor, and the ninth thin film transistor and the fifth thin film transistor are coupled in parallel or in series; the fourth electrostatic discharge protection circuit further comprises a tenth thin film transistor, and the tenth thin film transistor and the sixth thin film transistor are coupled in parallel or in series.

As the enable signal line is in a high voltage level state, the first thin film transistor and the second thin film transistor are in an on state, and as the enable signal line is in a low voltage level state, the first thin film transistor and the second thin film transistor are in an off state.

As the first thin film transistor and the second thin film transistor are in an on state, the display region works, and as the first thin film transistor and the second thin film transistor are in an off state, the display region stops working.

Compared with prior art, the technical solution of the present invention possesses benefits below:

In the technical solution of the present invention, the gate of each first thin film transistor is coupled to the enable signal line, and the drain of each first thin film transistor is coupled to the data line outer section of one data line, and the source of each first thin film transistor is coupled to the data line inner section of the same data line, and the gate of each second thin film transistor is coupled to the enable signal line, and the drain of each second thin film transistor is coupled to the scan line outer section of one scan line, and the source of each second thin film transistor is coupled to the scan line inner section of the same scan line. Namely, the first thin film transistor is coupled between the data line outer section and the data line inner section to be the switch, and the second thin film transistor is coupled between the scan line outer section and the scan line inner section to be the switch. Thus, both the data line and the scan line are divided into two sections. One section is located in the peripheral circuit region, and the other section is mainly located in the display region. The data line outer section and the scan line outer section are located in the peripheral circuit region, and the data line inner section and the scan line inner section extend from the peripheral circuit region to the display region. Moreover, one end of the first electrostatic discharge protection circuit is coupled to the data line outer section, and the other end is coupled to the short connection line; one end of the second electrostatic discharge protection circuit is coupled to the data line inner section, and the other end is coupled to the short connection line; one end of the third electrostatic discharge protection circuit is coupled to the scan line outer section, and the other end is coupled to the short connection line; one end of the fourth electrostatic discharge protection circuit is coupled to the scan line inner section, and the other end is coupled to the short connection line. Thus, the data line outer section and the scan line outer section are respectively coupled to the short connection line, and the data line inner section and the scan line inner section are also respectively coupled to the short connection line. The data line outer section and the scan line outer section are located in the peripheral circuit region. Under circumstance that there is high voltage electrostatic charge existing in the peripheral circuit region, the high voltage electrostatic charge is directly transmitted to the short connection line through the first electrostatic discharge protection circuit and the third electrostatic discharge protection circuit, and then is transmitted to the ground without influencing the components in the display region, and thus to prevent the breakdown of the component in the display region as the high voltage electrostatic charge accumulation of the peripheral circuit region is over large or as the high voltage electrostatic release point is close to the display region.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In the description of the invention, which needs explanation is that the term "installation", "connected", "connection" should be broadly understood unless those are clearly defined and limited, otherwise, For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

Figure 1:
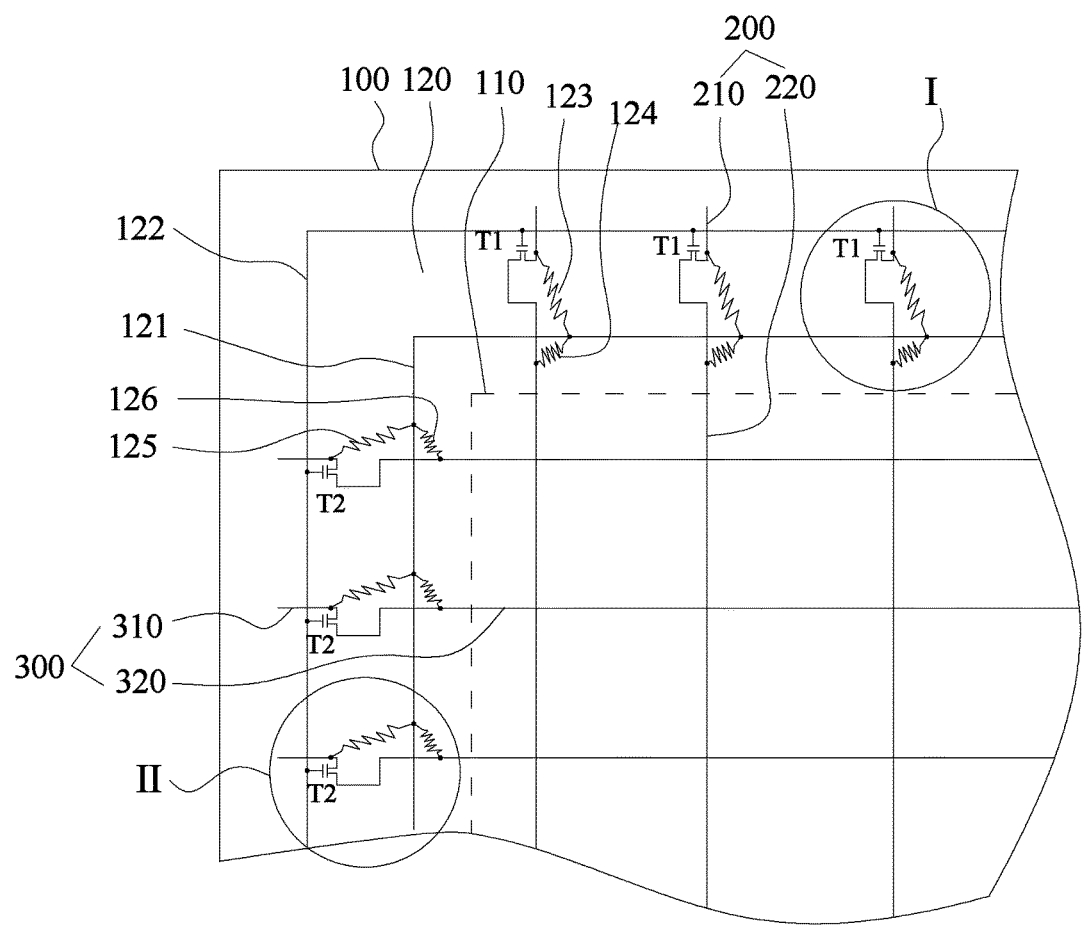
FIG. 1 is a structure diagram of an array substrate in the embodiment of the present invention.
Figure 2:
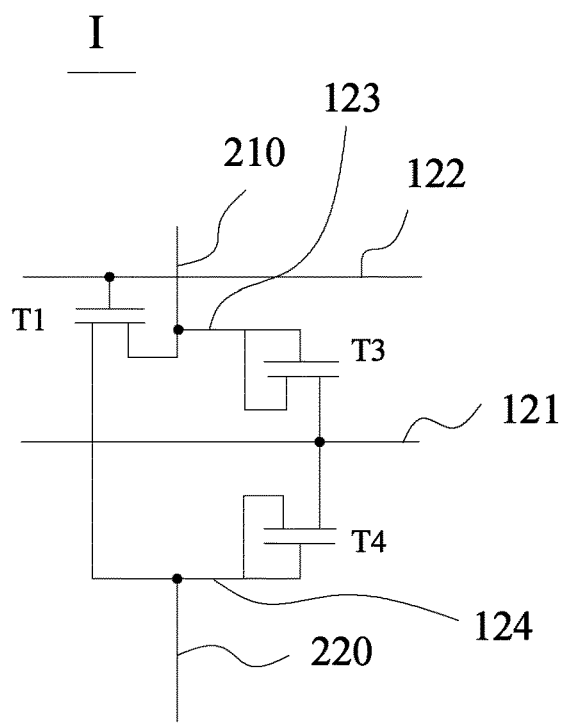
FIG. 2 is a structure diagram corresponding to a I portion in FIG. 1 in the first embodiment of the present invention.
Figure 3:
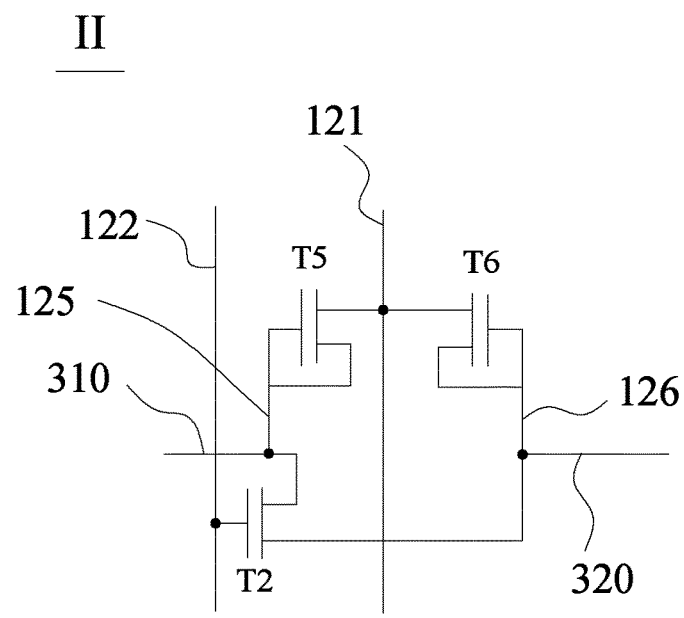
FIG. 3 is a structure diagram corresponding to a II portion in FIG. 1 in the first embodiment of the present invention.

Please refer to FIG. 1, FIG. 2 and FIG. 3. FIG. 1 is a structure diagram of an array substrate in the embodiment of the present invention; FIG. 2 is a structure diagram corresponding to a I portion in FIG. 1 in the first embodiment of the present invention; FIG. 3 is a structure diagram corresponding to a II portion in FIG. 1 in the first embodiment of the present invention.

In the first embodiment of the present invention, the array substrate comprises a substrate 100 and a plurality of data lines 200 located on the substrate 100 and a plurality of scan lines 300 located on the substrate 100.

The substrate 100 comprises a display region 110 and a peripheral circuit region 120 located at peripheral sides of the display region 110. The display region 110 is an region of showing images as the liquid crystal display device works. The display region 110 comprises a plurality of pixel regions (not shown in figures), and each pixel region comprises precision components, such as a thin film transistor, a pixel electrode and a common electrode.

In the embodiment of the present invention, each data line 200 comprises a data line outer section 210 and a data line inner section 220, and each scan line 300 comprises a scan line outer section 310 and a scan line inner section 320. Both the data line outer section 210 and the scan line outer section 310 are located in the peripheral circuit region 120, and both the data line inner section 220 and the scan line inner section 320 extends from the peripheral circuit region 120 to the display region 110.

In the embodiment of the present invention, the peripheral circuit region 120 further comprises a short connection line 121, an enable signal line 122, a plurality of first thin film transistors T1, a plurality of second thin film transistors T2, a plurality of first electrostatic discharge protection circuits 123, a plurality of second electrostatic discharge protection circuits 124, a plurality of third electrostatic discharge protection circuits 125 and a plurality of fourth electrostatic discharge protection circuits 126. Each data line 200 is correspondingly coupled to one first thin film transistor T1, one first electrostatic discharge protection circuit 123 and one second electrostatic discharge protection circuit 124. Each scan line 300 is correspondingly coupled to one second thin film transistor T2, one third electrostatic discharge protection circuit 125 and one fourth electrostatic discharge protection circuit 126.

Both each first thin film transistor T1 and each second thin film transistor T2 comprise a gate, a drain and a source. The specification of that each data line 200 is correspondingly coupled to one first thin film transistor T1 is, a gate of each first thin film transistor T1 is coupled to the enable signal line 122, and a drain of each first thin film transistor T1 is coupled to a data line outer section 210 of one corresponding data line 200, and a source of each first thin film transistor T1 is coupled to the data line inner section 220 of the same data line 200. The specification of that each scan line 300 is correspondingly coupled to one second thin film transistor T2 is, a gate of each second thin film transistor T2 is coupled to the enable signal line 122, and a drain of each second thin film transistor T2 is coupled to a scan line outer section 310 of one corresponding scan line 300, and a source of each second thin film transistor T2 is coupled to the scan line inner section 320 of the same scan line 300. Therefore, the on and off between the data line outer section 210 and the data line inner section 220 of the data line 200 is controlled according to the on or off of the first thin film transistor T1, and the on and off between the scan line outer section 310 and the scan line inner section 320 of the data line 300 is controlled according to the on or off of the second thin film transistor T2. The on and off of the first thin film transistor T1 and the second thin film transistor T2 is controlled by the enable signal line 122. Specifically, as the enable signal line 122 is in a high voltage level state, both the first thin film transistor T1 and the second thin film transistor T2 are in an on state, and as the enable signal line 122 is in a low voltage level state, the first thin film transistor T1 and the second thin film transistor T2 are in an off state.

In the embodiment of the present invention, one end of each first electrostatic discharge protection circuit 123 is coupled to the data line outer section 210, and the other end is coupled to the short connection line 121. One end of each second electrostatic discharge protection circuit 124 is coupled to the data line inner section 220, and the other end is coupled to the short connection line 121. One end of each third electrostatic discharge protection circuit 125 is coupled to the scan line outer section 310, and the other end is coupled to the short connection line 121. One end of each fourth electrostatic discharge protection circuit 126 is coupled to the scan line inner section 320, and the other end is coupled to the short connection line 121.

The enable signal line 122 is employed to control the on and off of the first thin film transistor T1 and the second thin film transistor T2. Specifically, the on and off of the first thin film transistor T1 and the second thin film transistor T2 can be controlled by sending the voltage signal. As the first thin film transistor T1 and the second thin film transistor T2 are in an on state, the display region 110 works, and as the first thin film transistor T1 and the second thin film transistor T2 are in an off state, the display region 110 stops working. Therefore, in the manufacture process of the array substrate, the enable signal line 122 is not electrified, which definitely make the first thin film transistor T1 and the second thin film transistor T2 in an off state. Thus, the data lien outer section 210 and the data line inner section 220 are in an off state, and the scan lien outer section 310 and the scan line inner section 320 are also in an off state. Then, the data line 200 and the scan line 300 are not conducted in the manufacture process of the array substrate. As the electrostatic charges flow from the peripheral circuit region 120 to the data lien outer section 210 and the scan lien outer section 310, the electrostatic charges respectively and directly flow to the short connection line 121 through the first electrostatic discharge protection circuit 123 and the third electrostatic discharge protection circuit 125 to derive the electrostatic charges to the ground (not shown in figure) without passing through the display region 110. Accordingly, the electrostatic charges cannot influence the display region 110 to prevent the electrostatic breakdown or the damage of the component in the display region 110; as there is electrostatic charge in the display region 110, the electrostatic charges directly flow to the short connection line 121 through the second electrostatic discharge protection circuit 124 and the fourth electrostatic discharge protection circuit 126 to derive the electrostatic charges to the ground.

The first electrostatic discharge protection circuit 123 and the third electrostatic discharge protection circuit 125 are employed to derive the electrostatic charge of the peripheral circuit region 120. Thus, the electrostatic charge of the peripheral circuit region 120 is independently derived to the short connection line 121, and to derive the electrostatic charge of the peripheral circuit region 120 to the ground. The second electrostatic discharge protection circuit 124 and the fourth electrostatic discharge protection circuit 126 are employed to derive the electrostatic charge of the display region 110. Thus, the electrostatic charge of the display region 110 is independently derived to the short connection line 121, and to derive the electrostatic charge of the display region 110 to the ground.

Furthermore, referring to FIG. 2, and FIG. 2 is a structure diagram corresponding to a I portion in FIG. 1 in the first embodiment of the present invention. The first electrostatic discharge protection circuit 123 comprises a third thin film transistor T3, and a gate and a drain of the third thin film transistor T3 are coupled to the data line outer section 210, and a source of the third thin film transistor T3 is coupled to the short connection line 121 to form a switch between the data line outer section 210 and the short connection line 121. The second electrostatic discharge protection circuit 124 comprises a fourth thin film transistor T4, and a gate and a drain of the fourth thin film transistor T4 are coupled to the data line inner section 220, and a source of the fourth thin film transistor T4 is coupled to the short connection line 121 to form a switch between the data line inner section 220 and the short connection line 121.

Furthermore, referring to FIG. 3, and FIG. 3 is a structure diagram corresponding to a II portion in FIG. 1 in the first embodiment of the present invention. The third electrostatic discharge protection circuit 125 comprises a fifth thin film transistor T5, and a gate and a drain of the fifth thin film transistor T5 are coupled to the data line outer section 310, and a source of the fifth thin film transistor T5 is coupled to the short connection line 121 to form a switch between the scan line outer section 310 and the short connection line 121. The fourth electrostatic discharge protection circuit 126 comprises a sixth thin film transistor T6, and a gate and a drain of the sixth thin film transistor T6 are coupled to the data line inner section 320, and a source of the sixth thin film transistor T6 is coupled to the short connection line 121 to form a switch between the scan line inner section 320 and the short connection line 121.

The electrostatic discharge protection procedure of the array substrate is described in detail below. For being easy, simple and clear, in the following description of the electrostatic discharge protection, the electrostatic discharge protection corresponding to the data line and the electrostatic discharge protection corresponding to the scan line are described individually in accordance with FIG. 2 and FIG. 3, respectively. However, the electrostatic discharge protection corresponding to the data line and the electrostatic discharge protection corresponding to the scan line can be performed at the same time. A gate of each first thin film transistor T1 is coupled to the enable signal line 122.

Please refer to FIG. 1 and FIG. 2. As the display region 110 is in the working state, the enable signal line 122 is in a high voltage level state, and the first thin film transistor T1 is in an on state. As the high voltage electrostatic charge of the peripheral circuit region 120 is transmitted to the data line outer section 210, due to that the gate of the first thin film transistor T1 is coupled to the enable signal line 122, and the resistance is large, the high voltage electrostatic charge prefers to flow to the gate of the third thin film transistor T3 of the first electrostatic discharge protection circuit 123, and rapidly activates the gate of the third thin film transistor T3, and the electrostatic charges flow to the drain of the third thin film transistor T3. Because the gate of the third thin film transistor T3 is in an on state, the electrostatic charges flowing to the drain of the third thin film transistor T3 will continues to be transmitted to the source of the third thin film transistor T3, and thus to be transmitted to the short connection line 121. Then, the electrostatic charge is derived to the ground without passing through the display region 110.

As the display region 110 does not work, the enable signal line 122 is in a low voltage level state, and the first thin film transistor T1 is in an off state. As the high voltage electrostatic charge of the peripheral circuit region 120 is transmitted to the data line outer section 210, due to that the first thin film transistor T1 is in the off state, the high voltage electrostatic charge prefers to flow to the gate of the third thin film transistor T3 of the first electrostatic discharge protection circuit 123, and rapidly activates the gate of the third thin film transistor T3, and the electrostatic charges flow to the drain of the third thin film transistor T3. Because the gate of the third thin film transistor T3 is in an on state, the electrostatic charges flowing to the drain of the third thin film transistor T3 will continues to be transmitted to the source of the third thin film transistor T3, and thus to be transmitted to the short connection line 121. Then, the electrostatic charge is derived to the ground without passing through the display region 110.

Consequently, no matter whether the display region 110 works or not, i.e. no matter whether the array substrate is in the usage state, the third thin film transistor T3 (i.e. the first electrostatic discharge protection circuit 123) still can derive the electrostatic charge of the peripheral circuit region 120 to the ground, and then to avoid the electrostatic charge of the peripheral circuit region 120 entering the display region 110, and thus to prevent the breakdown of the component in the display region 110 as the high voltage electrostatic charge accumulation of the peripheral circuit region 120 is over large or as the high voltage electrostatic release point is close to the display region 110.

As the electrostatic charges generate in the display region 110, the electrostatic charges flow to the gate and the drain of the fourth thin film transistor T4 of the second electrostatic discharge protection circuit 124 through the data line inner section 220, and activate the gate of the fourth thin film transistor T4 to make the same in an on state, and then the electrostatic charges flow from the drain of the fourth thin film transistor T4 to the source of the fourth thin film transistor T4, and then is transmitted to the short connection line 121, and the electrostatic charges are derived to the ground.

Please refer to FIG. 1 and FIG. 3. As the display region 110 is in the working state, the enable signal line 122 is in a high voltage level state, and the second thin film transistor T2 is in an on state. As the high voltage electrostatic charge of the peripheral circuit region 120 is transmitted to the scan line outer section 310, due to that the gate of the second thin film transistor T2 is coupled to the enable signal line 122, and the resistance is large, the high voltage electrostatic charge prefers to flow to the gate of the fifth thin film transistor T5 of the third electrostatic discharge protection circuit 125, and rapidly activates the gate of the fifth thin film transistor T5, and the electrostatic charges flow to the drain of the fifth thin film transistor T5. Because the gate of the fifth thin film transistor T5 is in an on state, the electrostatic charges flowing to the drain of the fifth thin film transistor T5 will continues to be transmitted to the source of the fifth thin film transistor T5, and thus to be transmitted to the short connection line 121. Then, the electrostatic charge is derived to the ground without passing through the display region 110.

As the display region 110 does not work, the enable signal line 122 is in a low voltage level state, and the second thin film transistor T2 is in an off state. As the high voltage electrostatic charge of the peripheral circuit region 120 is transmitted to the scan line outer section 310, due to that the second thin film transistor T2 is in the off state, the high voltage electrostatic charge prefers to flow to the gate of the fifth thin film transistor T5, and rapidly activates the gate of the fifth thin film transistor T5, and the electrostatic charges flow to the drain of the fifth thin film transistor T5. Because the gate of the fifth thin film transistor T5 is in an on state, the electrostatic charges flowing to the drain of the fifth thin film transistor T5 will continues to be transmitted to the source of the fifth thin film transistor T5, and thus to be transmitted to the short connection line 121. Then, the electrostatic charge is derived to the ground without passing through the display region 110.

Consequently, no matter whether the display region 110 works or not, i.e. no matter whether the array substrate is in the usage state, the fifth thin film transistor T5 (i.e. the third electrostatic discharge protection circuit 125) still can derive the electrostatic charge of the peripheral circuit region 120 to the ground, and then to avoid the electrostatic charge of the peripheral circuit region 120 entering the display region 110, and thus to prevent the breakdown of the component in the display region 110 as the high voltage electrostatic charge accumulation of the peripheral circuit region 120 is over large or as the high voltage electrostatic release point is close to the display region 110.

As the electrostatic charges generate in the display region 110, the electrostatic charges flow to the gate and the drain of the sixth thin film transistor T6 of the fourth electrostatic discharge protection circuit 126 through the scan line inner section 320, and activate the gate of the sixth thin film transistor T6 to make the same in an on state, and then the electrostatic charges flow from the drain of the sixth thin film transistor T6 to the source of the sixth thin film transistor T6, and then is transmitted to the short connection line 121, and the electrostatic charges are derived to the ground.

In this embodiment, the gate of each first thin film transistor is coupled to the enable signal line, and the drain of each first thin film transistor is coupled to the data line outer section of one data line, and the source of each first thin film transistor is coupled to the data line inner section of the same data line, and the gate of each second thin film transistor is coupled to the enable signal line, and the drain of each second thin film transistor is coupled to the scan line outer section of one scan line, and the source of each second thin film transistor is coupled to the scan line inner section of the same scan line. Namely, the first thin film transistor is coupled between the data line outer section and the data line inner section to be the switch, and the second thin film transistor is coupled between the scan line outer section and the scan line inner section to be the switch. Thus, both the data line and the scan line are divided into two sections. One section is located in the peripheral circuit region, and the other section is mainly located in the display region. The data line outer section and the scan line outer section are located in the peripheral circuit region, and the data line inner section and the scan line inner section extend from the peripheral circuit region to the display region. Moreover, one end of the first electrostatic discharge protection circuit is coupled to the data line outer section, and the other end is coupled to the short connection line; one end of the second electrostatic discharge protection circuit is coupled to the data line inner section, and the other end is coupled to the short connection line; one end of the third electrostatic discharge protection circuit is coupled to the scan line outer section, and the other end is coupled to the short connection line; one end of the fourth electrostatic discharge protection circuit is coupled to the scan line inner section, and the other end is coupled to the short connection line. Thus, the data line outer section and the scan line outer section are respectively coupled to the short connection line, and the data line inner section and the scan line inner section are also respectively coupled to the short connection line. The data line outer section and the scan line outer section are located in the peripheral circuit region. Under circumstance that there is high voltage electrostatic charge existing in the peripheral circuit region, the high voltage electrostatic charge is directly transmitted to the short connection line through the first electrostatic discharge protection circuit and the third electrostatic discharge protection circuit, and then is transmitted to the ground without influencing the components in the display region, and thus to prevent the breakdown of the component in the display region as the high voltage electrostatic charge accumulation is over large or as the high voltage electrostatic release point is close to the display region.

Figure 4:
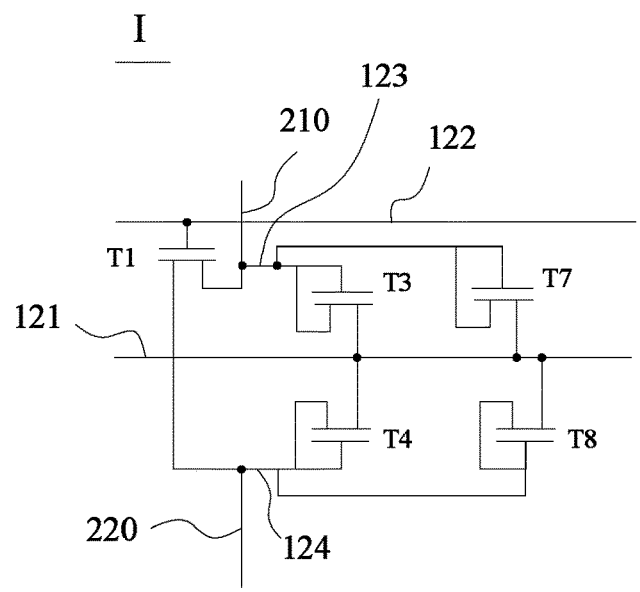
FIG. 4 is a structure diagram corresponding to a I portion in FIG. 1 in the second embodiment of the present invention.
Figure 5:
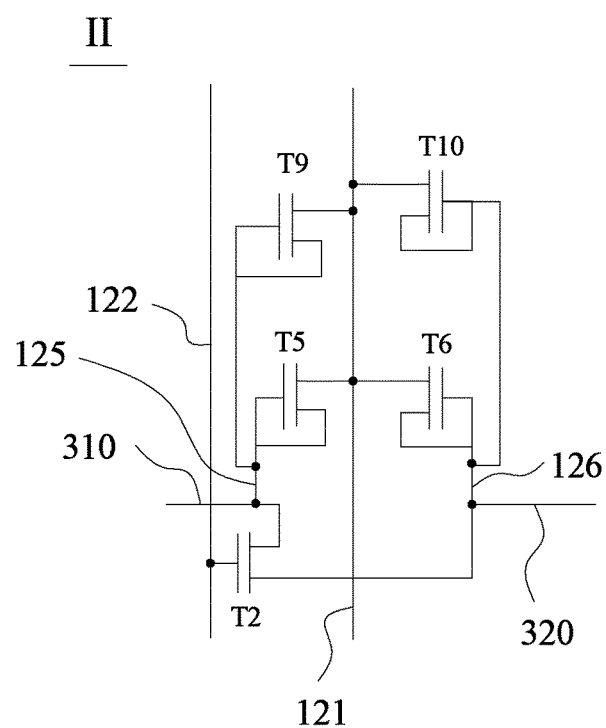
FIG. 5 is a structure diagram corresponding to a II portion in FIG. 1 in the second embodiment of the present invention.

Please refer to FIG. 1, FIG. 4 and FIG. 5. FIG. 1 is a structure diagram of an array substrate in the embodiment of the present invention; FIG. 4 is a structure diagram corresponding to a I portion in FIG. 1 in the second embodiment of the present invention; FIG. 5 is a structure diagram corresponding to a II portion in FIG. 1 in the second embodiment of the present invention. The structure of the array substrate in the second embodiment of the present invention is basically the same as the structure of the array substrate in the first embodiment. The difference is: the first electrostatic discharge protection circuit 123 of the array substrate in this embodiment (the second embodiment) further comprises a seventh thin film transistor T7, and the seventh thin film transistor T7 and the third thin film transistor T3 are coupled in parallel; the second electrostatic discharge protection circuit 124 further comprises an eighth thin film transistor T8, and the eighth thin film transistor T8 and the fourth thin film transistor T4 are coupled or in parallel; the third electrostatic discharge protection circuit 125 further comprises a ninth thin film transistor T9, and the ninth thin film transistor T9 and the fifth thin film transistor T5 are coupled in parallel; the fourth electrostatic discharge protection circuit 126 further comprises a tenth thin film transistor T10, and the tenth thin film transistor T10 and the sixth thin film transistor are coupled in parallel. Therefore, all the first electrostatic discharge protection circuit 123, the second electrostatic discharge protection circuit 124, the third electrostatic discharge protection circuit 125 and the fourth electrostatic discharge protection circuit 126 comprise two thin film transistors coupled in parallel.

In other embodiments except this embodiment, all the first electrostatic discharge protection circuit 123, the second electrostatic discharge protection circuit 124, the third electrostatic discharge protection circuit 125 and the fourth electrostatic discharge protection circuit 126 comprise more thin film transistors coupled in parallel.

In this embodiment, all the first electrostatic discharge protection circuit 123, the second electrostatic discharge protection circuit 124, the third electrostatic discharge protection circuit 125 and the fourth electrostatic discharge protection circuit 126 comprise at least two thin film transistors coupled in parallel. Thus, as one thin film transistor in one electrostatic discharge protection circuit is damaged and only can be in the off state, the other thin film transistor can normally work. Then, all the first electrostatic discharge protection circuit 123, the second electrostatic discharge protection circuit 124, the third electrostatic discharge protection circuit 125 and the fourth electrostatic discharge protection circuit 126 can remain the original function. For instance, as the third thin film transistor T3 of the first electrostatic discharge protection circuit 123 is damaged and only can be in the off state, if the high voltage electrostatic charge of the peripheral circuit region 120 is transmitted to the data line outer section 210 and the third thin film transistor T3 is damaged and cannot work, the high voltage electrostatic charge still can activate the gate of the seventh thin film transistor T7. Thus, the electrostatic charges flow from the drain of the seventh thin film transistor T7 to the source of the seventh thin film transistor T7, and then flow from the source of the seventh thin film transistor T7 to the short connection line 121. Accordingly, the high voltage electrostatic charge of the peripheral circuit region 120 is derived to the ground. Accordingly, the first electrostatic discharge protection circuit 123 still remains the original function, and in comparison with the first embodiment, the second embodiment of the present invention can further prevent the breakdown of the component in the display region as the high voltage electrostatic charge accumulation of the peripheral circuit region 120 is over large or as the high voltage electrostatic release point is close to the display region.

Figure 6:
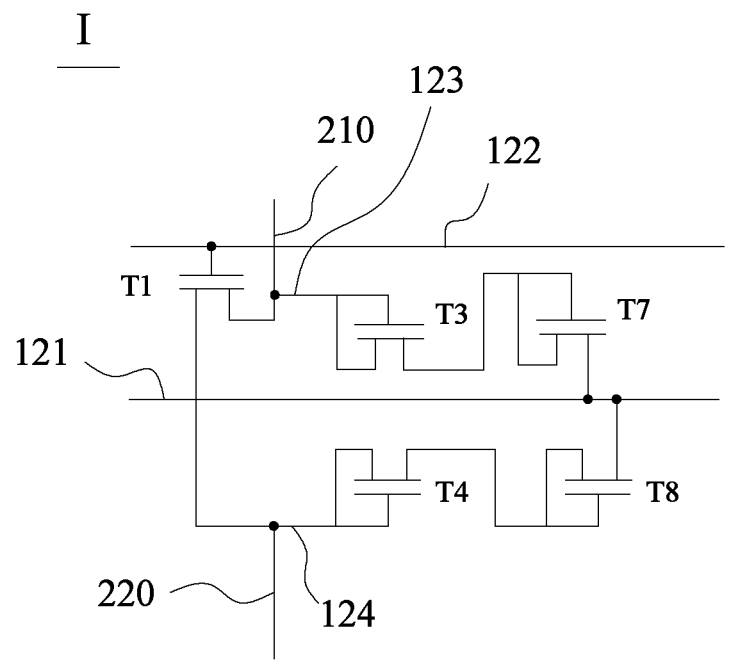
FIG. 6 is a structure diagram corresponding to a I portion in FIG. 1 in the third embodiment of the present invention.
Figure 7:
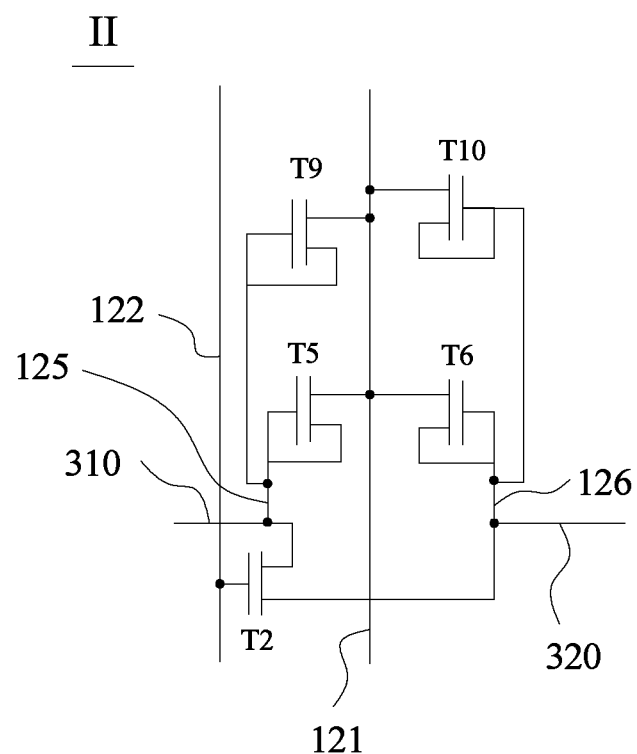
FIG. 7 is a structure diagram corresponding to a II portion in FIG. 1 in the third embodiment of the present invention.

Please refer to FIG. 1, FIG. 6 and FIG. 7. FIG. 1 is a structure diagram of an array substrate in the embodiment of the present invention; FIG. 6 is a structure diagram corresponding to a I portion in FIG. 1 in the third embodiment of the present invention; FIG. 7 is a structure diagram corresponding to a II portion in FIG. 1 in the third embodiment of the present invention. The structure of the array substrate in the third embodiment of the present invention is basically the same as the structure of the array substrate in the first embodiment. The difference is: the first electrostatic discharge protection circuit 123 of the array substrate in this embodiment (the third embodiment) further comprises a seventh thin film transistor T7, and the seventh thin film transistor T7 and the third thin film transistor T3 are coupled in series; the second electrostatic discharge protection circuit 124 further comprises an eighth thin film transistor T8, and the eighth thin film transistor T8 and the fourth thin film transistor T4 are coupled or in series; the third electrostatic discharge protection circuit 125 further comprises a ninth thin film transistor T9, and the ninth thin film transistor T9 and the fifth thin film transistor T5 are coupled in series; the fourth electrostatic discharge protection circuit 126 further comprises a tenth thin film transistor T10, and the tenth thin film transistor T10 and the sixth thin film transistor are coupled in series. Therefore, all the first electrostatic discharge protection circuit 123, the second electrostatic discharge protection circuit 124, the third electrostatic discharge protection circuit 125 and the fourth electrostatic discharge protection circuit 126 comprise two thin film transistors coupled in series.

In other embodiments except this embodiment, all the first electrostatic discharge protection circuit 123, the second electrostatic discharge protection circuit 124, the third electrostatic discharge protection circuit 125 and the fourth electrostatic discharge protection circuit 126 comprise more thin film transistors coupled in series.

In this embodiment, all the first electrostatic discharge protection circuit 123, the second electrostatic discharge protection circuit 124, the third electrostatic discharge protection circuit 125 and the fourth electrostatic discharge protection circuit 126 comprise at least two thin film transistors coupled in series. Thus, as one thin film transistor in one electrostatic discharge protection circuit is damaged and only can be in the short circuit state, the other thin film transistor can normally work to prevent the condition that the array substrate cannot work because of the short circuit of the data line outer section 210 and the short connection line 121. Then, all the first electrostatic discharge protection circuit 123, the second electrostatic discharge protection circuit 124, the third electrostatic discharge protection circuit 125 and the fourth electrostatic discharge protection circuit 126 can remain the original function. For instance, as the third thin film transistor T3 of the first electrostatic discharge protection circuit 123 is damaged and only can be in the short circuit state, if the high voltage electrostatic charge of the peripheral circuit region 120 is transmitted to the data line outer section 210 and the third thin film transistor T3 is damaged and cannot work, the high voltage electrostatic charge still can activate the gate of the seventh thin film transistor T7. Thus, the electrostatic charges flow from the drain of the seventh thin film transistor T7 to the source of the seventh thin film transistor T7, and then flow from the source of the seventh thin film transistor T7 to the short connection line 121. Accordingly, the high voltage electrostatic charge of the peripheral circuit region 120 is derived to the ground. Accordingly, the first electrostatic discharge protection circuit 123 still remains the original function, and prevents the condition that the array substrate cannot work because of the short circuit of the data line outer section 210 and the short connection line 121.

The present invention further provides a liquid crystal display device. The liquid crystal display device comprises the array substrate of any embodiments or implementations shown in FIG. 1 to FIG. 7.

In the description of the present specification, the reference terms, "one embodiment", "some embodiments", "an illustrative embodiment", "an example", "a specific example", or "some examples" mean that such description combined with the specific features of the described embodiments or examples, structure, material, or characteristic is included in the utility model of at least one embodiment or example. In the present specification, the terms of the above schematic representation do not certainly refer to the same embodiment or example. Meanwhile, the particular features, structures, materials, or characteristics which are described may be combined in a suitable manner in any one or more embodiments or examples.

Above are embodiments of the present invention, which does not limit the scope of the present invention. Any modifications, equivalent replacements or improvements within the spirit and principles of the embodiment described above should be covered by the protected scope of the invention.

What is claimed is:

1. An array substrate, comprising a substrate and a plurality of data lines and a plurality of scan lines located on the substrate; wherein the substrate comprises a display region and a peripheral circuit region located at peripheral sides of the display region, and each data line comprises a data line outer section and a data line inner section, and each scan line comprises a scan line outer section and a scan line inner section, and the data line outer section and the scan line outer section are located in the peripheral circuit region, and both the data line inner section and the scan line inner section extend from the peripheral circuit region to the display region;

the peripheral circuit region further comprises a short connection line, an enable signal line, a plurality of first thin film transistors, a plurality of second thin film transistors, a plurality of first electrostatic discharge protection circuits, a plurality of second electrostatic discharge protection circuits, a plurality of third electrostatic discharge protection circuits and a plurality of fourth electrostatic discharge protection circuits, and both gates of each first thin film transistor and each second thin film transistor are coupled to the enable signal line, and a drain of the first thin film transistor is coupled to a data line outer section of one data line, and a source of the first thin film transistor is coupled to a data line inner section of the same data line; a drain of the second thin film transistor is coupled to a scan line outer section of one scan line, and a source of the second thin film transistor is coupled to a scan line inner section of the same scan line; one end of the first electrostatic discharge protection circuit is coupled to the data line outer section, and the other end is coupled to the short connection line; one end of the second electrostatic discharge protection circuit is coupled to the data line inner section, and the other end is coupled to the short connection line; one end of the third electrostatic discharge protection circuit is coupled to the scan line outer section, and the other end is coupled to the short connection line; one end of the fourth electrostatic discharge protection circuit is coupled to the scan line inner section, and the other end is coupled to the short connection line; the enable signal line controls on or off of the first thin film transistor and the second thin film transistor;

wherein the first electrostatic discharge protection circuit comprises a third thin film transistor, and a gate and a drain of the third thin film transistor are coupled to the data line outer section, and a source is coupled to the short connection line, and the second electrostatic discharge protection circuit comprises a fourth thin film transistor, and a gate and a drain of the fourth thin film transistor are coupled to the data line inner section, and a source is coupled to the short connection line; and wherein the first electrostatic discharge protection circuit further comprises a seventh thin film transistor, and the seventh thin film transistor and the third thin film transistor are coupled in parallel; and the second electrostatic discharge protection circuit further comprises an eighth thin film transistor, and the eighth thin film transistor and the fourth thin film transistor are coupled in parallel.

2. The array substrate according to claim 1, wherein the third electrostatic discharge protection circuit comprises a fifth thin film transistor, and a gate and a drain of the fifth thin film transistor are coupled to the scan line outer section, and a source of the fifth thin film transistor is coupled to the short connection line, and the fourth electrostatic discharge protection circuit comprises a sixth thin film transistor, and a gate and a drain of the sixth thin film transistor are coupled to the scan line inner section, and a source of the sixth thin film transistor is coupled to the short connection line.

3. The array substrate according to claim 2, wherein the third electrostatic discharge protection circuit further comprises a ninth thin film transistor, and the ninth thin film transistor and the fifth thin film transistor are coupled in parallel; the fourth electrostatic discharge protection circuit further comprises a tenth thin film transistor, and the tenth thin film transistor and the sixth thin film transistor are coupled in parallel.

4. The array substrate according to claim 1, wherein as the enable signal line is in a high voltage level state, the first thin film transistor and the second thin film transistor are in an on state, and as the enable signal line is in a low voltage level state, the first thin film transistor and the second thin film transistor are in an off state.

5. The array substrate according to claim 2, wherein as the enable signal line is in a high voltage level state, the first thin film transistor and the second thin film transistor are in an on state, and as the enable signal line is in a low voltage level state, the first thin film transistor and the second thin film transistor are in an off state.

6. The array substrate according to claim 3, wherein as the enable signal line is in a high voltage level state, the first thin film transistor and the second thin film transistor are in an on state, and as the enable signal line is in a low voltage level state, the first thin film transistor and the second thin film transistor are in an off state.

7. The array substrate according to claim 1, wherein as the first thin film transistor and the second thin film transistor are in an on state, the display region works, and as the first thin film transistor and the second thin film transistor are in an off state, the display region stops working.

8. A liquid crystal display device, wherein the liquid crystal display device comprises an array substrate, and the array substrate comprises a substrate and a plurality of data lines and a plurality of scan lines located on the substrate; wherein the substrate comprises a display region and a peripheral circuit region located at peripheral sides of the display region, and each data line comprises a data line outer section and a data line inner section, and each scan line comprises a scan line outer section and a scan line inner section, and the data line outer section and the scan line outer section are located in the peripheral circuit region, and both the data line inner section and the scan line inner section extend from the peripheral circuit region to the display region;

the peripheral circuit region further comprises a short connection line, an enable signal line, a plurality of first thin film transistors, a plurality of second thin film transistors, a plurality of first electrostatic discharge protection circuits, a plurality of second electrostatic discharge protection circuits, a plurality of third electrostatic discharge protection circuits and a plurality of fourth electrostatic discharge protection circuits, and both gates of each first thin film transistor and each second thin film transistor are coupled to the enable signal line, and a drain of the first thin film transistor is coupled to a data line outer section of one data line, and a source of the first thin film transistor is coupled to a data line inner section of the same data line; a drain of the second thin film transistor is coupled to a scan line outer section of one scan line, and a source of the second thin film transistor is coupled to a can line inner section of the same can line; one end of the first electrostatic discharge protection circuit is coupled to the data line outer section, and the other end is coupled to the short connection line; one end of the second electrostatic discharge protection circuit is coupled to the data line inner section, and the other end is coupled to the short connection line; one end of the third electrostatic discharge protection circuit is coupled to the scan line outer section, and the other end is coupled to the short connection line; one end of the fourth electrostatic discharge protection circuit is coupled to the scan line inner section, and the other end is coupled to the short connection line; the enable signal line controls on or off of the first thin film transistor and the second thin film transistor;

wherein the first electrostatic discharge protection circuit comprises a third thin film transistor, and a gate and a drain of the third thin film transistor are coupled to the data line outer section, and a source is coupled to the short connection line, and the second electrostatic discharge protection circuit comprises a fourth thin film transistor, and a gate and a drain of the fourth thin film transistor are coupled to the data line inner section, and a source is coupled to the short connection line; and wherein the first electrostatic discharge protection circuit further comprises a seventh thin film transistor, and the seventh thin film transistor and the third thin film transistor are coupled in parallel; and the second electrostatic discharge protection circuit further comprises an eighth thin film transistor, and the eighth thin film transistor and the fourth thin film transistor are coupled in parallel.

9. The liquid crystal display device according to claim 8, wherein the third electrostatic discharge protection circuit comprises a fifth thin film transistor, and a gate and a drain of the fifth thin film transistor are coupled to the scan line outer section, and a source of the fifth thin film transistor is coupled to the short connection line, and the fourth electrostatic discharge protection circuit comprises a sixth thin film transistor, and a gate and a drain of the sixth thin film transistor are coupled to the scan line inner section, and a source of the sixth thin film transistor is coupled to the short connection line.

10. The liquid crystal display device according to claim 9, wherein the third electrostatic discharge protection circuit further comprises a ninth thin film transistor, and the ninth thin film transistor and the fifth thin film transistor are coupled in parallel; the fourth electrostatic discharge protection circuit further comprises a tenth thin film transistor, and the tenth thin film transistor and the sixth thin film transistor are coupled in parallel.

11. The liquid crystal display device according to claim 8, wherein as the enable signal line is in a high voltage level state, the first thin film transistor and the second thin film transistor are in an on state, and as the enable signal line is in a low voltage level state, the first thin film transistor and the second thin film transistor are in an off state.

12. The liquid crystal display device according to claim 8, wherein as the first thin film transistor and the second thin film transistor are in an on state, the display region works, and as the first thin film transistor and the second thin film transistor are in an off state, the display region stops working.

\* \* \* \* \*